United States Patent
Matsunaka et al.

(10) Patent No.: US 6,341,042 B1
(45) Date of Patent: Jan. 22, 2002

(54) LASER RADIATING APPARATUS AND METHODS FOR MANUFACTURING A POLYCRYSTALLINE SEMICONDUCTOR FILM AND A LIQUID CRYSTAL DISPLAY DEVICE

(75) Inventors: Shigeki Matsunaka, Yokohama; Atsushi Fujihara, Chigaseki; Tsutomu Kakuno, Fujisawa, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/493,066

(22) Filed: Jan. 28, 2000

(30) Foreign Application Priority Data

Jan. 29, 1999 (JP) .......................................... 11-021335

(51) Int. Cl.[7] .................. G02B 27/10; G02B 17/00; F21V 29/00
(52) U.S. Cl. .................. 359/618; 359/364; 362/268
(58) Field of Search ............................... 359/618, 599, 359/364; 362/268, 301, 371

(56) References Cited

U.S. PATENT DOCUMENTS 5,219,344 A * 6/1993 Yoder, Jr. ...................... 606/5
5,548,403 A * 8/1996 Sommargren ............... 356/354

OTHER PUBLICATIONS

Sumitomo Heavy Industries Technical Review. vol. 44, No. 130 Apr. 1996. A design concept (ex. monitor etc) of the production system will be explained in this paper as a laser annealing system manufacturere for recent generation. pp. 64–67.

* cited by examiner

*Primary Examiner*—Georgia Epps
*Assistant Examiner*—Tim Thompson
(74) *Attorney, Agent, or Firm*—Pillsbury Winthrop LLP

(57) ABSTRACT

A laser radiating apparatus controls an intensity of energy of a laser beam output from a laser generating device and radiates an object with the laser beam. The laser radiating apparatus includes an intensity homogenizer for substantially homogenizing distribution of the intensity of energy of the laser beam, an imaging lens for converging the laser beam substantially homogenized by the intensity homogenizer and radiating an object with the laser beam, a slit for removing a part of the converged laser beam and shaping it into a predetermined beam shape, a detector for detecting an intensity of energy of the part of the laser beam removed by the slit, and a control device for controlling the intensity of energy of the laser beam based on a detection signal output from the detector.

7 Claims, 10 Drawing Sheets

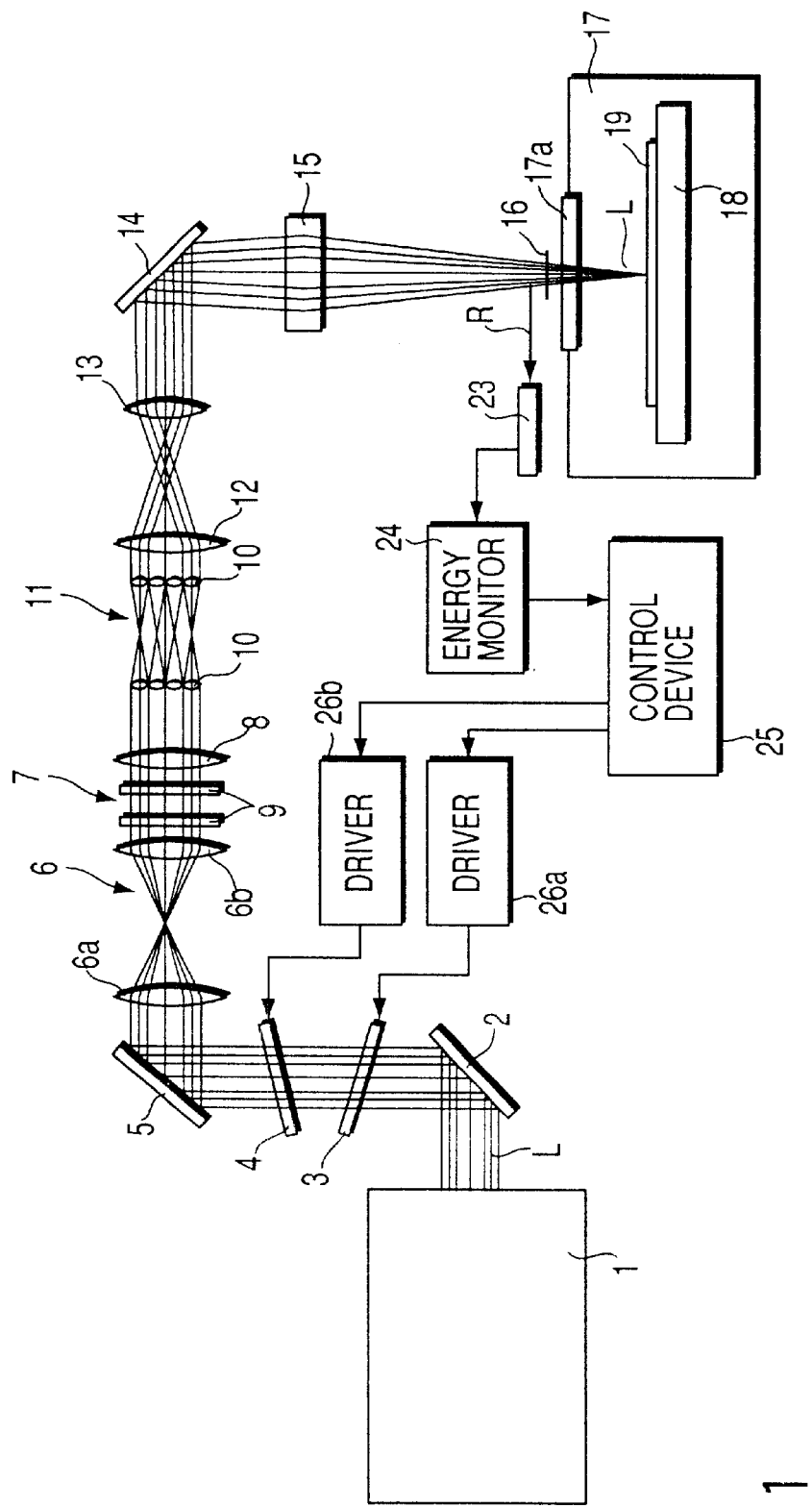
F I G. 1

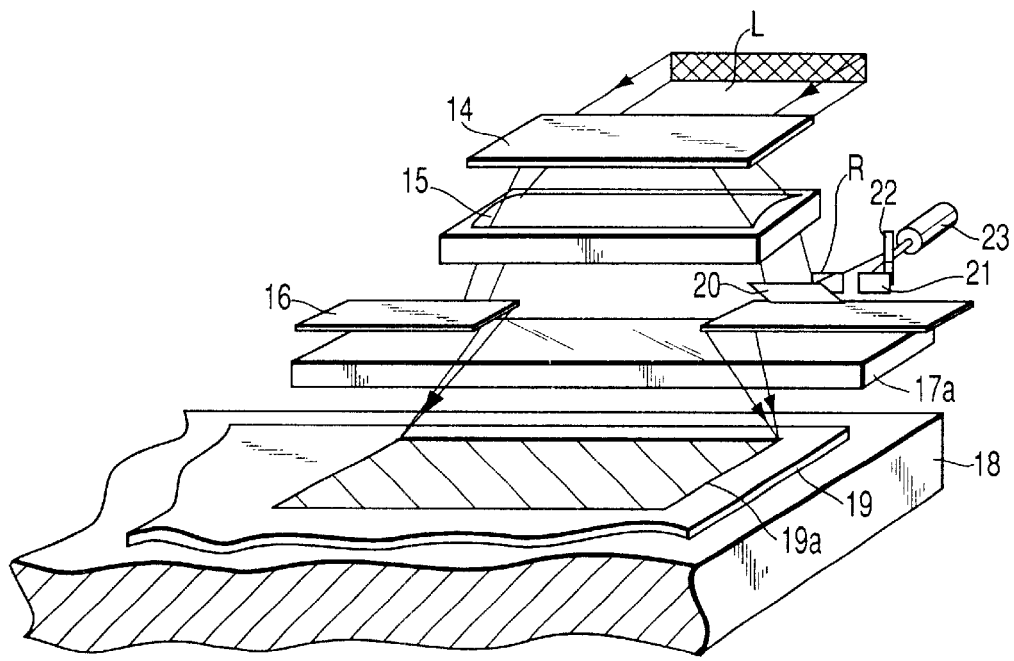
F I G. 2
F I G. 3A
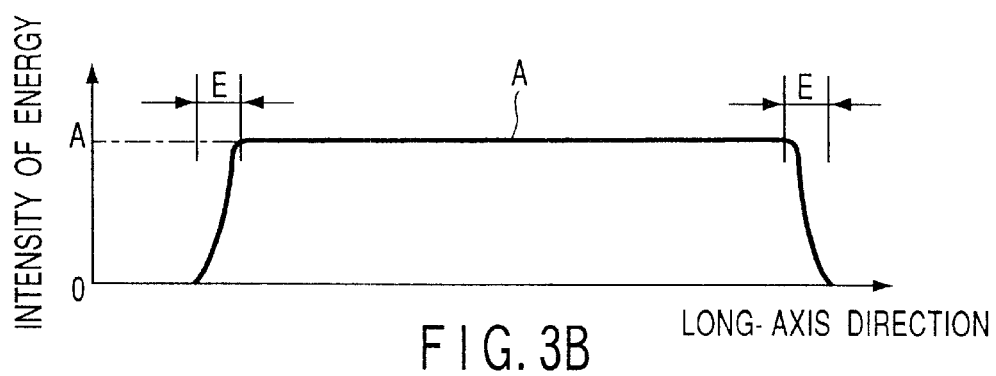
F I G. 3B

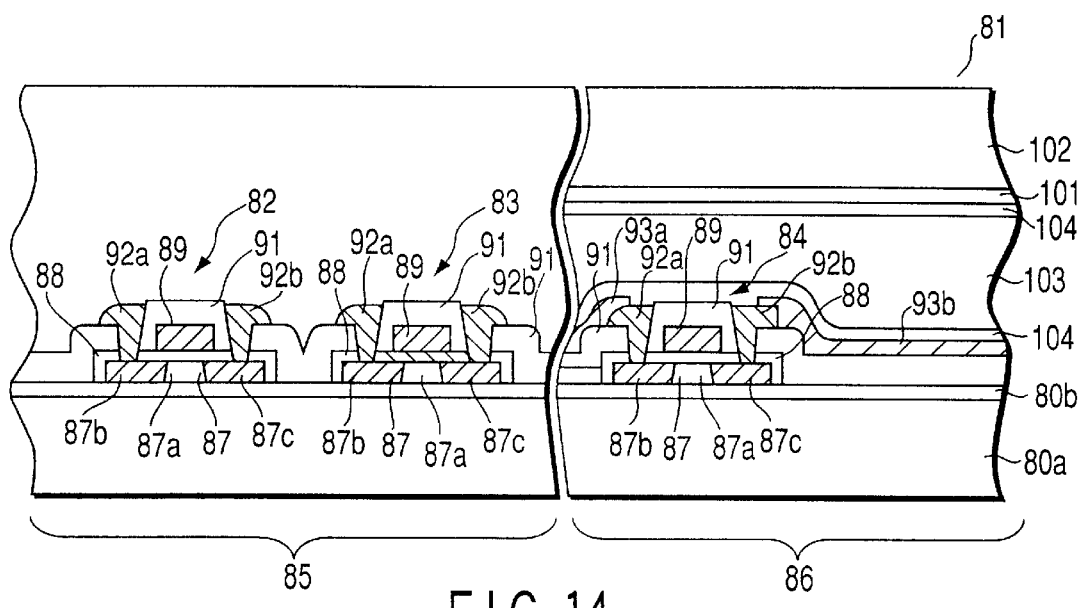
F I G. 14
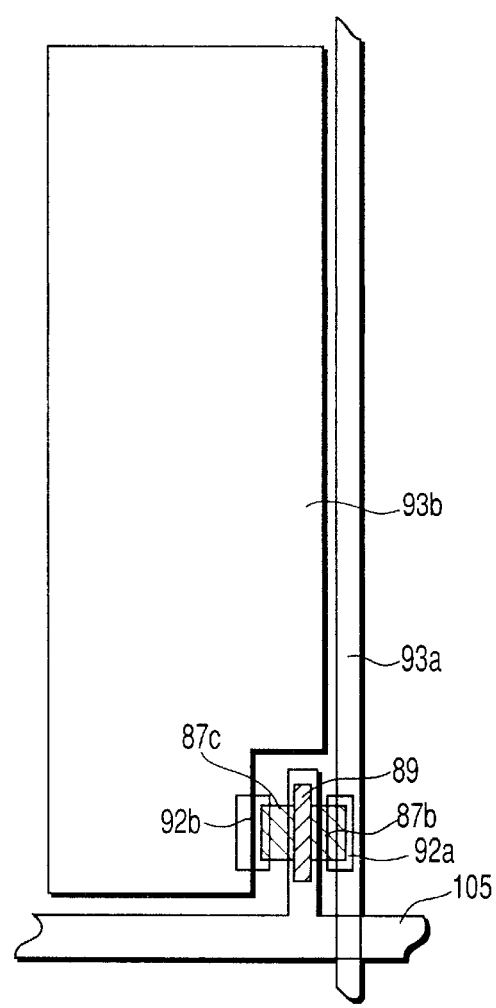
F I G. 15

LASER RADIATING APPARATUS AND METHODS FOR MANUFACTURING A POLYCRYSTALLINE SEMICONDUCTOR FILM AND A LIQUID CRYSTAL DISPLAY DEVICE

CROSS-REFERENCE TO RELATED APPLICATION

This application is based upon and claims the benefit of priority from the prior Japanese Patent Application No. 11-021335, filed Jan. 29, 1999; the entire contents of which are incorporated herein by reference.

BACKGROUND OF THE INVENTION

The present invention relates to a laser radiating apparatus for radiating a laser beam to an object, and methods for manufacturing a polycrystalline semiconductor film, for example, non-monocrystalline semiconductor film and a liquid crystal display device using the laser irradiating apparatus.

When a semiconductor device or a liquid crystal display device is manufactured, a photolithography step and an anneal step require radiation of light. In these steps, a thin film is processed by a laser beam.

For example, in the photolithography step, a mask image is transferred to photoresist on the semiconductor substrate by radiation of a laser beam emitted from a laser oscillator. In the anneal step, an amorphous semiconductor film, i.e., a non-monocrystalline semiconductor film, is annealed by radiation of a laser beam emitted from an excimer laser oscillator (ELA: Excimer Laser Anneal), so that it is polycrystallized. The process time is shortened by the excimer laser anneal process, resulting in improvement of the manufacturing efficiency (throughput).

The laser radiating apparatus for performing the aforementioned processes by means of the laser beam has a laser oscillator. The laser beam output from the laser oscillator is passed through an optical system comprising an optical element, such as a homogenizer. The optical system substantially homogenizes the distribution of intensity of the laser beam, and shapes the laser beam to a predetermined form of the beam radiation surface. Then, the laser beam is guided to and irradiates an object to be processed.

In a process using the laser beam as described above, the intensity of energy of the laser beam radiated on the object must be controlled with high accuracy to increase the accuracy of the process. To control the intensity of energy of a laser beam, part of the laser beam output from the laser oscillator is split by split means, for example, a semi-transparent mirror, and the intensity of energy of the split laser beam is detected. Based on the detection value, the intensity of energy of the laser beam output from the laser oscillator is controlled.

The laser beam for irradiating the object passes through an optical system comprising a plurality of optical elements, such as a homogenizer and a focusing lens. Since these optical elements or the like absorb the optical energy of the laser beam, an optical loss is caused in the light path in the optical system before the light beam reaches the object.

On the other hand, the laser beam split to detect the intensity of energy is directly incident on the detector without passing through an optical element. Therefore, there is substantially no loss in the optical energy of the intensity of energy detected by the detector.

For this reason, the intensity of energy of the laser beam detected by the detector is different from that of the light beam irradiating the object. In this state, if the intensity of energy of the laser beam output from the laser oscillator is controlled on the basis of the intensity detected by the detector, the intensity of energy on the radiation surface of the laser beam cannot be controlled with high accuracy. The control method is disadvantageous in this respect.

The aforementioned anneal process will now be described. In this process, an amorphous silicon film, i.e., a semiconductor film, formed as a thin film on the glass substrate is radiated with a line beam of a laser beam in the ultraviolet wave range, such as an excimer laser, as shown in FIG. 16. As a result, the amorphous silicon film can be polycrystallized to form a semiconductor film with high electron mobility.

In this process, since the amorphous silicon is instantaneously melted and crystallized, a polycrystalline silicon film can be formed by a low-temperature process at about 450° C. or lower, in which the substrate is damaged little by heat. Thus, the process is advantageous in that a non-monocrystalline silicon film can be formed on a glass substrate, which is less heat-resistant, large in area, and inexpensive.

The electron mobility is represented by the equation: $\mu=|vd/E|$ $(cm^2/S \cdot V)$. It stands for an average drift speed (vd (cm/s)) of electrons in a crystal per unit field, when an electric field E (V/cm) is applied to the crystal.

The non-monocrystalline silicon also includes a state during a phase transition from amorphous silicon to polycrystalline silicon. The amorphous silicon to be annealed by the laser beam has a high purity, but the percentage of amorphous silicon is not necessarily 100. Therefore, when the amorphous silicon is annealed by the laser beam in the process described above, once the ratio of the polycrystalline silicon is increased while the amorphous silicon is decreased, the amorphous silicon can be used as non-monocrystalline silicon.

Use of the non-monocrystalline silicon film provides a thin film transistor (TFT) having high electron mobility on the glass substrate in the low-temperature process described above. With the non-monocrystalline silicon TFT, it is possible to obtain a thin and high-definition liquid crystal display device, called a driver monolithic type, which uses an active matrix substrate made of a driver TFT (complementary transistor) and a pixel TFT formed on a glass substrate.

In an LCD unit formed on a glass substrate, as shown in FIG. 17, the driver TFT is controlled by gate lines (scanning lines) and data lines (signal lines), so that an image is displayed by applying a voltage to the liquid crystal.

The driver TFT comprising, a gate driver and a source driver, controls the gate lines and the data lines. Each driver receives an image signal and a synchronous signal through a signal control unit and power from a power source unit. The gate driver is a digital circuit having a function of selecting every gate line in one frame (60 Hz), and operated at cycles of a scanning time (15 to 40 microseconds).

The source driver applies a voltage of the gate line to a liquid crystal filed between a pixel electrode made of a transparent ITO (Indium Tin Oxide) film on the array substrate and a counter pixel electrode on the counter substrate, so that a voltage in accordance with image information can be applied via the pixel TFT to the liquid crystal. Since the display in liquid crystal is deteriorated when a DC voltage is continuously applied thereto, voltages of the opposite polarities are alternately applied to the pixel electrode and the counter electrode (inversion driving). The source driver is driven at a high frequency of 20 to 100 MHz. Therefore, since the driver TFT is required to be operated at a high frequency, the electron mobility therein must be high.

To obtain a non-monocrystalline silicon having the satisfactory characteristics as described above, it is necessary to increase the accuracy in the anneal process by accurately controlling the intensity of energy of the radiated laser beam. However, according to the conventional art, since a laser beam having suitable energy intensity cannot be radiated on the object for the reasons described above, an anneal process with high accuracy cannot be performed.

BRIEF SUMMARY OF THE INVENTION

An object of the present invention is to provide a laser radiating apparatus in which a difference in intensity of energy between a laser beam for detecting the intensity of energy and a laser beam radiated on an object is suppressed to the minimum, so that the intensity of energy of the laser beam radiated on the object can be set with high accuracy to carry out a satisfactory process.

According to the present invention, there is provided a laser radiating apparatus for controlling an intensity of energy of a laser beam output from a laser generating means and radiating an object with the laser beam, the apparatus comprising: intensity homogenizing means for substantially homogenizing distribution of the intensity of energy of the laser beam; converging optical means for condensing the laser beam substantially homogenized by the intensity homogenizing means and radiating the object with the laser beam; shaping means for removing a part of the condensed laser beam and shaping it into a predetermined beam shape; detecting means for detecting an intensity of energy of the part of the laser beam removed by the shaping means; and control means for controlling the intensity of energy of the laser beam based on a detection signal output from the detecting means.

With the present invention, when the intensity of energy of a laser beam to be radiated on the object is detected and controlled, a difference in intensity of energy between the laser beam for detecting the intensity of energy and the laser beam radiated on the object is suppressed to the minimum. For this reason, the intensity of energy to be radiated on the object can be controlled with high accuracy. In addition, since the intensity of energy of the laser beam is detected by means of an unnecessary laser beam removed by the shaping means, the intensity of energy of the laser beam for use in processing the object can be detected without loss.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram showing the overall structure of a laser radiating apparatus according to a first embodiment of the present invention;

FIG. 2 is a perspective view of a unit incorporated in the laser radiating apparatus for removing a part of a laser beam and detecting the removed part of the laser beam;

FIG. 3A is a cross-sectional view showing a beam shape of a line-shaped laser beam whose energy is uniformed;

FIG. 3B is a distribution diagram showing the state of energy of the line-shaped laser beam;

FIG. 14 is a schematic cross-sectional view showing a structure of a liquid crystal display device of driver monolithic type obtained by a fourth embodiment of the present invention;

FIG. 15 is a schematic plan view showing a structure of the pixel portion of the device shown in FIG. 14;

DETAILED DESCRIPTION OF THE INVENTION

Figure 4A:
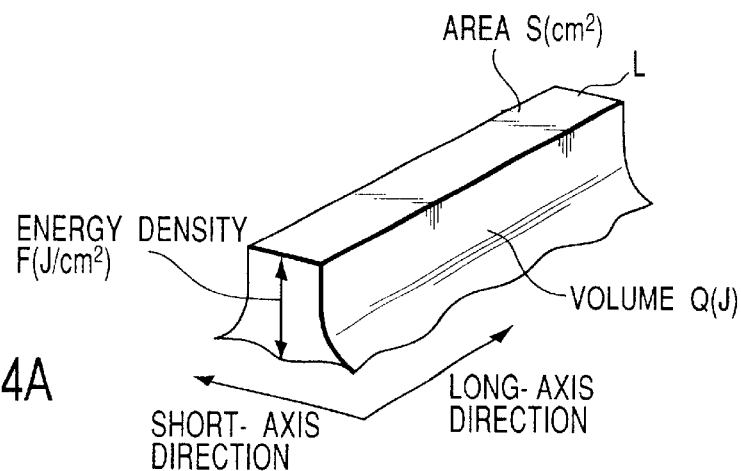
FIG. 4A is a perspective view showing the state of energy of the line-shaped laser beam.

Embodiments of the present invention will be described with reference to the accompanying drawings. FIGS. 1 to 4 show a first embodiment of the present invention. The laser radiating apparatus shown in FIG. 1 comprises a laser generating means, for example, a laser oscillator 1. The laser oscillator 1 is, for example, an XeCl excimer laser. A laser beam L having a rectangular beam shape pulse-output from the laser oscillator 1 is reflected by a first reflection mirror 2 and incident on a variable attenuator 3. The intensity of energy of the laser beam L is adjusted by the variable attenuator 3. After the optical path is compensated by a compensator 4, the laser beam is incident on a second reflection mirror 5.

The laser beam L reflected by the second reflection mirror 5 is incident on a telescope 6. The telescope 6 comprises a first lens 6a and a second lens 6b having different focal lengths and arranged such that the focal points thereof coincide with each other. The beam diameter of the laser beam L incident on the first lens 6a is enlarged and a parallel beam is emitted from the second lens 6b.

The distribution of the intensity of energy along the long axis of the laser beam L emitted from the telescope 6 is substantially homogenized by a long-axis homogenizer 7. The laser beam is imaged by a long-axis imaging lens 8 constituting the long-axis homogenizer 7. The long-axis homogenizer 7 includes a pair of long-axis cylindrical lens arrays 9 spaced at a predetermined distance.

The distribution of the intensity of energy along the short axis of the laser beam L emitted from the long-axis imaging lens 8 is substantially homogenized by a short-axis homogenizer 11. The short-axis homogenizer 11 includes a pair of short-axis cylindrical lens arrays 10 spaced at a predetermined distance. The laser beam is imaged by a first short-axis imaging lens 12 constituting the short-axis homogenizer 11. The laser beam emitted from the first short-axis imaging lens 12 is incident on a short-axis field lens 13.

Thus, the beam shape of the laser beam L output from the laser oscillator 1 is shaped into a rectangle having a long axis and a short axis as shown in FIG. 3A by the long-axis imaging lens 8 of the long-axis homogenizer 7 and the first short-axis imaging lens 12 of the short axis homogenizer 11. As shown in FIG. 3B, the distribution of the intensity of energy is substantially uniformed at the intensity represented by "A" except for both end portions of the beam along the long axis.

The laser beam L emitted from the short-axis field lens 13 is reflected by a third reflection mirror 14 and imaged by a second short-axis imaging lens 15. Then, the laser beam is shaped by a first slit 16, constituting a shaping means, into a predetermined shape. In this embodiment, both end portions of the rectangular beam as described above are removed, and the shaped beam is incident on a process chamber 17 where the anneal process or the like is carried out. More specifically, as shown in FIG. 3B, the first slit 16 removes both end portions (edge portions) E of the beam where the intensity of energy is gradually decreased, i.e., the end portions slightly including the portion having the energy intensity uniformed at the energy A. The beam from which the both end portions are removed is incident on the process chamber 17. The portions E are not used for radiation of an object (glass substrate) 19, i.e., for an anneal process.

The process chamber 17 has a transmission window 17a. The laser beam L imaged by the second short-axis imaging lens 15 is radiated on the object 19 mounted on a mount table 18 through the transmission window 17a.

As shown in FIG. 2, an amorphous silicon film 19a to be anneal-processed by the laser beam L is uniformly deposited on the upper surface of the object 19. More specifically, undercoat and an amorphous semiconductor film are uniformly deposited on the object 19 to a predetermined thickness by means of CVD (Chemical Vapor Deposition) or the like. In this embodiment, the amorphous silicon film has a thickness of about 50 nm to 100 nm. The undercoat ($SiO_x$, $SiN_x$, or TEOS (Tetra Ethyl Orthosilicate: $Si[OC_2H_5]_4$)) formed thereunder has a thickness of about 0.35 $\mu$m to 0.40 $\mu$m.

The first slit 16 is designed to shape the laser beam L, such that the length in the long-axis direction of the line beam is the same as the width of the amorphous silicon film 19a. In other words, when the laser beam L is radiated on the amorphous silicon film 19a to carry out an anneal process, the first slit 16 removes the unnecessary portions (the portions E) of the laser beam L which do not contribute to the annealing process.

As shown in FIG. 2, a rectangular fourth reflection mirror 20 is arranged in a path of the removed laser beam R, i.e., one of the ends of the laser beam L along the longitudinal direction, removed by the first slit 16. The fourth reflection mirror 20 reflects the removed laser beam R in a predetermined direction. The removed laser beam R reflected by the fourth reflection mirror 20 is shaped by a long-axis slit 21, thereafter by a short-axis slit 22, and incident on a detector 23 for detecting the intensity of energy.

Figure 4B:
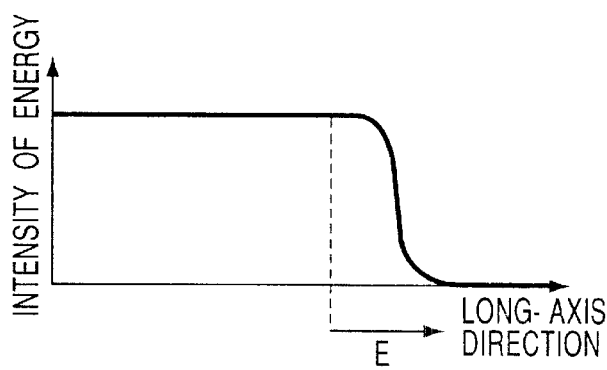
FIG. 4B is a distribution diagram showing the intensity of energy of the removed part of the laser beam at an end portion along the long axis.
Figure 4C:
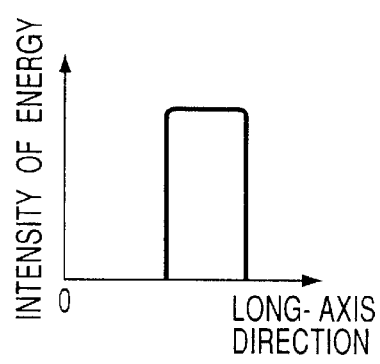
FIG. 4C is a distribution diagram showing the intensity of energy of the removed part of the laser beam along the long axis after being shaped by a longaxis slit.
Figure 4D:
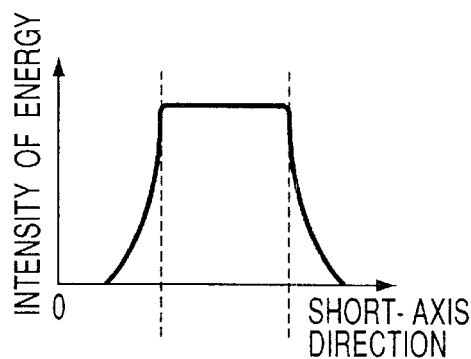
FIG. 4D is a distribution diagram showing the intensity of energy of the removed part of the laser beam along the short axis after being shaped by the long-axis slit.

The long-axis slit 21 has a function of removing a part of the removed laser R along the long axis. More specifically, it removes an end portion along the long axis of the removed laser beam R (an end portion of the thin rectangular beam along the long axis) as shown in FIG. 4B, where the intensity of energy is low. Then, only a portion of the removed laser beam, having a uniform intensity of energy as shown in FIG. 4C, is incident on the short-axis slit 22.

Figure 4E:
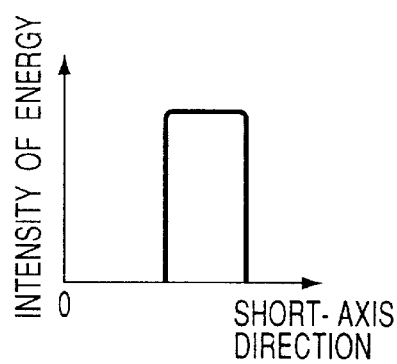
FIG. 4E is a distribution diagram showing the intensity of energy of the removed part of the laser beam along the short axis after being shaped by a short-axis slit.

The short-axis slit 22 has a function of removing parts of the removed laser R shaped by the long-axis slit 21. More specifically, it removes both end portions along the width direction of the removed laser beam R (end portions of the thin rectangular beam along the width direction) shown in FIG. 4D, where the intensity of energy is low. Then, only a portion of the removed laser beam, having a uniform intensity of energy as shown in FIG. 4E, is incident on the detector 23. As a result, the accuracy of detecting the intensity of energy of the removed laser beam R by the detector 23 is increased.

An energy intensity signal (detection signal), representing the intensity of energy of the removed laser beam R detected by the detector 23, is input to a control device 25 via an energy monitor 24. The control device 25 can set required intensity of energy of the laser beam L in accordance with the kind of a process to which the object 19 is subjected. The control device 25 compares the set intensity of energy with the intensity of energy of the removed laser beam R detected by the detector 23.

If there is a difference between the compared values, a driving signal corresponding to the difference is output to the drivers 26a and 26b for driving the variable attenuator 3 and the compensator 4. As a result, the intensity of the laser beam L passed through the variable attenuator 3 is corrected to the same value as the set intensity. The path of the light beam passed through the variable attenuator 3 is compensated by the compensator 4 so as not to be deviated from the original path.

The control device 25 processes the detection signal detected by the detector 23 as follows. Since the waveform of the removed laser beam R removed by the first slit 16 is detected by the detector 23 as a waveform having an integrated energy, the control device 25 holds the peak value of the waveform, so that the analog data is processed as digital data.

According to the basic performance of the detector 23, the average value of energy of the detector 23 varies linearly relative to the transmittance of the variable attenuator 3. If linearity is not obtained, the laser waveform may be subjected to curve approximation.

Generally, since linearity is obtained, the following equation (1) is held:

$$Q = j \cdot T + k \quad (1)$$

where Q represents an energy value, T represents transmittance of the variable attenuator and j and k represent coefficients.

Even if the energy value represented by the following equation (2) is changed to $Q_2$ represented by the following equation (3) when the laser anneal is started, the transmittance of the variable attenuator 3 is varied so as to maintain the energy of $Q_1$:

$$Q_1 = j \cdot T_1 + k \quad (2)$$

$$Q_2 = j \cdot T_1 + k \quad (3).$$

The rate of increase or decrease of energy is calculated by canceling the coefficient k, and fed-back transmittance $T_2$ is calculated from the following equation (4) using the equation (1).

$$T_2 = [Q_1\{Q_1-k\}/(Q_2-k)]-k]/j \quad (4).$$

The variable attenuator 3 is driven on the basis of the result of the equation (4) so as to make the transmittance $T_2$. Thus, the intensity of energy of the laser beam L passed through the variable attenuator 3 can be controlled to be constant.

With the laser radiating apparatus having the above structure, the intensity of energy of the laser beam L is detected by the detector 23, which detects the intensity of energy of the removed laser beam R shaped by the first slit 16 immediately before the laser beam L is incident on the process chamber 17.

The optical path of the laser beam L radiated on the object 19 is substantially the same as that of the removed laser beam R whose energy intensity is detected by the detector 23. Therefore, the optical losses due to the optical elements in the paths of the laser beams L and R are substantially the same. Accordingly, the intensities of energy of the laser beams are also substantially the same. Thus, the intensity of energy of the laser beam L radiated on the object 19 can be detected accurately from the intensity of energy of the removed laser beam R.

For this reason, even if the intensity of energy of the laser beam L output from the laser oscillator 1 varies with time, if the transmittance of the variable attenuator 3 (the angle with respect to the laser beam L) is controlled on the basis of the detection signal output from the detector 23, the intensity of energy of the laser beam L radiated on the object 19 can be controlled to be approximate to the value set by the control device 25 with substantially no error.

The detector 23 detects the intensity of energy of the removed laser beam R removed by the first slit 16. The first slit 16 removes unnecessary portions of the laser beam L which are not required to process the object 19, i.e., the portions of the laser beam outside the ends of the amorphous silicon film 19a in its width direction, when the laser beam radiates the overall width of the film 19a. Therefore, when intensity of energy of the laser beam L is detected, the laser beam L for use in processing the object 19 is not wasted.

In addition, the removed laser beam R split by the first slit 16 includes a portion in which the intensity of energy is uniformed at an end portion along the longitudinal direction of the long rectangular beam. Therefore, since the intensity of energy of the removed laser beam R is substantially the same as that of the laser beam L radiated on the object 19, the latter can be controlled with high accuracy by the detection signal.

Moreover, both end portions of the removed laser beam R, in which the uniformity of the intensity of energy is low, are removed by the short-axis slit 22, before the removed laser beam R is incident on the detector 23. Therefore, the detection accuracy of the removed laser beam R by the detector 23 is further increased, with the result that the intensity of energy of the laser beam L can be controlled more accurately.

With the laser radiating apparatus according to the first embodiment, when the intensity of energy of the laser beam radiated on the object is controlled by detecting the intensity of energy of the laser beam, a difference in intensity of energy between the laser beam for detecting the intensity of energy and the laser beam radiated on the object is suppressed to the minimum. Therefore, the intensity of energy of the laser beam radiated on the object can be controlled with high accuracy. Moreover, since the unnecessary laser beam removed by the shaping means is used to detect the intensity of energy, the laser beam for use in processing the object is not wasted to detect the intensity.

Figure 5:
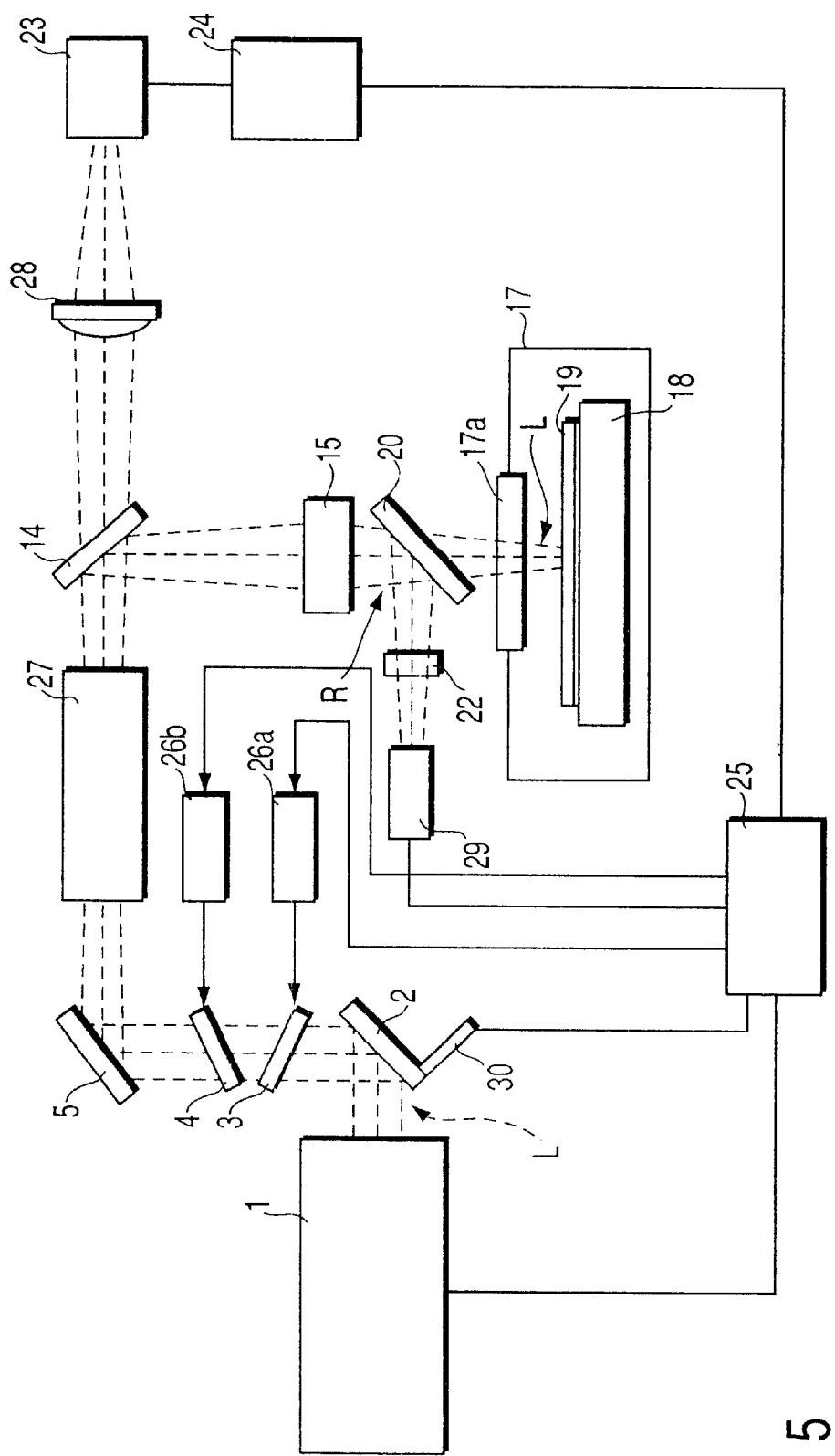
FIG. 5 is a diagram showing the overall structure of a laser radiating apparatus according to a second embodiment of the present invention.

FIG. 5 is a schematic diagram showing the structure of a laser radiating apparatus according to a second embodiment of the present invention. In FIG. 5, the elements having the same functions as those shown in FIGS. 1 and 2 are identified by the same reference numerals, and detailed descriptions thereof are omitted.

In FIG. 5, a shaping optical system 27 uniforms the intensity of energy and shapes a laser beam L. A third reflection mirror 14 reflects the incident laser beam L toward a second short-axis imaging lens 15 and transmits a part of the laser beam. The transmitted laser beam is guided through a lens 28 to a detector 23 for monitoring the output waveform of the laser beam L and deviation of the optical axis. The detector 23 comprises a bipolar photoelectric tube and a CCD.

A beam profiler 29 comprising a CCD for measuring spatial distribution of intensity of the laser beam L is arranged in a position to which light is reflected by a fourth reflection mirror 20. The fourth reflection mirror 20 is removably inserted between the second short-axis imaging lens 15 and a transmission window 17a. Only at the off-line time, the fourth reflection mirror is inserted between the second short-axis imaging lens 15 and the transmission window 17a, so that the laser beam L is guided toward the beam profiler 29. In this embodiment, both the detector 23 and the beam profiler 29 measure the laser beam. They may be separated from each other, but located at positions where the removed laser beam R can be measured in the same manner as in the first embodiment in order to prevent an optical loss due to the optical elements.

In the laser radiating apparatus, when a gas laser medium in the laser oscillator 1 is deteriorated, it may renewed. When the transmission window 17a is contaminated, it may be replaced. In this time, the distribution of the intensity of energy of the laser beam L at a work point on the object 19 may be varied. The reason is considered that the optical axis of the laser beam L is deviated when the gas laser medium is filled or the transmission window 17a is replaced.

Figure 6:
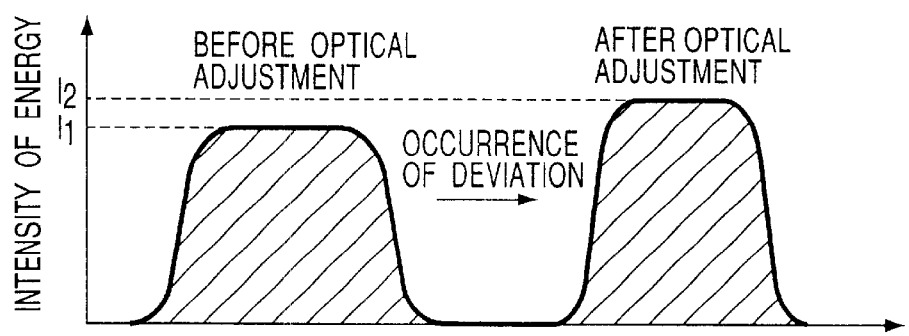
FIG. 6 is a distribution diagram showing a change in energy intensity distribution before and after optical adjustment.

When the optical axis of the laser beam L is deviated, even if the sums of the radiation energy in the shaded portions in FIG. 6, before and after the deviation, are the same, the peak value of the intensity of energy may be changed from $I_1$ to $I_2$. In this case, a proper anneal process cannot be performed.

Figure 7:
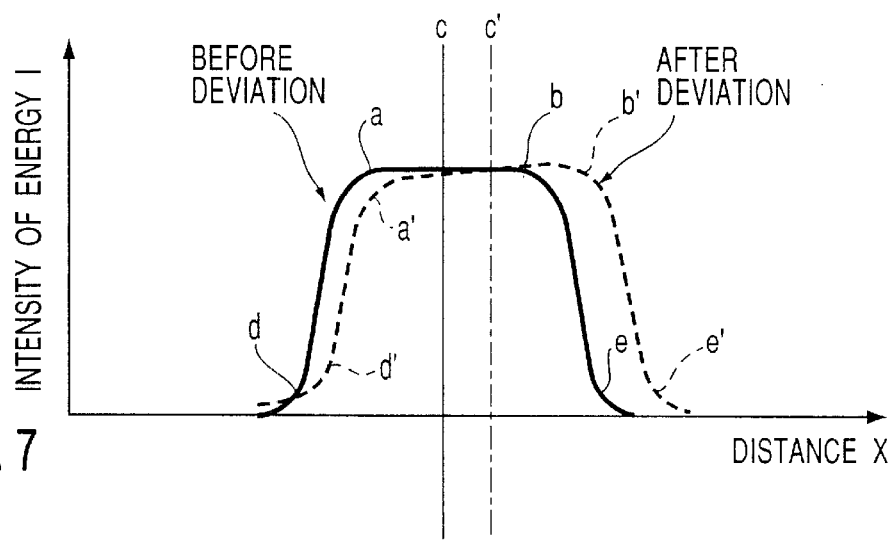
FIG. 7 is an enlarged view of each distribution shown in FIG. 6.

To prevent this, in the off-line state before the anneal process, the optical axis of the laser beam is ;-; adjusted to a proper position by means of the detector 23. Thereafter, from the distribution of intensity of energy shown in FIG. 7 in the cross section across the short axis (along the long axis) measured by the beam profiler 29, a point c, i.e., the center of distribution of intensity, is calculated in accordance with the equation: (b−a)/2=c. The points a and b are the shoulder points of the distribution. The points d and e represent points at which the rate of change turns from a flat portion, where the rate is constant, to a steep portion where the rate is greatly changed. The points a', b', c', d' and e' are the corresponding points of the distribution of intensity across the short axis when the optical axis is deviated.

If one of the values (c'−c), (d'−d) and (e'−e) exceeds a predetermined value (e.g., 10 μm), an actuator 30 attached to the first reflection mirror 2 is driven so that the values of c' and c are equal (c'−c=0). The distribution of intensity across the short axis is adjusted optimally by the above operation. If the deviation cannot be corrected by driving the actuator 30, the laser oscillator 1 itself may be defective. In this case, the anneal process is stopped.

When the gas laser medium is renewed as described above, the impedance of the discharge circuit of the laser oscillator 1 is changed. The impedance of the discharge circuit is also changed, when the gas laser medium is deteriorated. In this case, the output waveform of the laser beam L is changed, resulting in a change in beam quality, such as the beam shape and the angle of divergence. Therefore, even if the output of the laser oscillator 1 is kept constant by means of measuring the energy at a work point, the anneal process cannot be performed satisfactorily as the gas laser medium is deteriorated.

Figure 8:
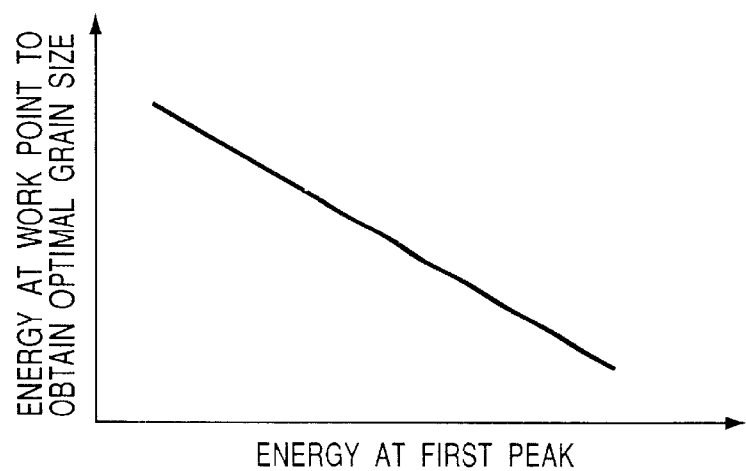
FIG. 8 is a graph showing the relationship between energies at a first peak and a work point where an optimal grain size is obtained, when the laser radiating apparatus of the present invention is used.

However, the present inventor confirmed that, when the integral value of the area of the laser output waveform is constant, the energy at a work point to obtain a target average grain size and the first peak value of the waveform have a linear relationship as shown in FIG. 8. Accurate monitoring is realized and the target average grain size is obtained by utilizing the relationship in the manner as will be described below.

Figure 9:
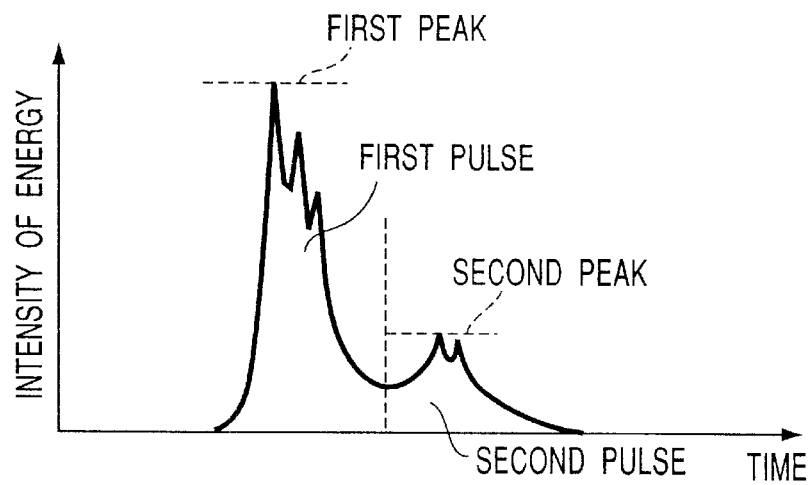
FIG. 9 is a distribution diagram showing an example of a laser output waveform obtained by the laser radiating apparatus of the present invention.
Figure 10:
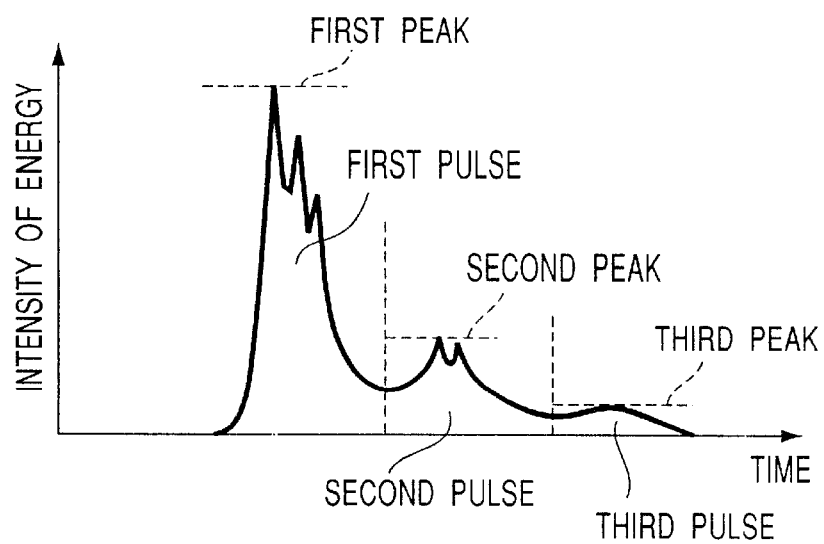
FIG. 10 is a distribution diagram showing another example of a laser output waveform obtained by the laser radiating apparatus of the present invention.

As shown in FIGS. 9 and 10, the output waveform of the laser beam is divided by broken lines into first to third pulses. The peak values of the first to third pulses are called first to third peaks. Thus, the pulses and the peaks of the output waveform are defined. An optimal anneal process is performed on the basis of the waveform.

The output waveform of the laser beam L is measured by the detector 23. At the same time, the area integral values of the respective pulses, the area integral value of the overall waveform, and the respective peak values are detected. Further, since the output of the laser oscillator 1 varies a little from moment to moment, the average value of the pulse energies measured at the work point is calculated (preferably the average value of five or more pulses). Based on the above results, when the solutions of the following equations (5) and (6) are constant, an optimal anneal process can be performed. However, if the waveform has only two peaks, the equation (6) is calculated with the third value 0.

(Area Integral Value of First Pulse×Average Energy at Work Point)/Overall Area Integral Value=Constant (5)

(First Peak Value×Average Energy at Work Point)/(First Peak Value+Second Peak Value+Third Peak Value)=Constant (6)

The transmittance of the variable attenuator 3 (the angle with respect to the laser beam L) is controlled so as to satisfy the above equations. However, the anneal process progresses, the amount of transmitted light in the overall optical system is varied. As a result, the area integral values of energy and the peak values are changed. Therefore, the constant value is calculated from the area integral values of energy and the peak value per unit area. It is preferable that the constant value vary within 5% thereof, although it varies depending on conditions of the gas laser medium or the like. If the variation exceeds a predetermined value, the anneal process is stopped.

If the laser beam L passed through the second short-axis imaging lens 15 is used on the basis of the result shown in FIG. 8, an anneal process satisfactory to a certain degree can be carried out by controlling the transmittance of the variable attenuator 3 so as to make the absolute value of the first peak value constant.

The spatial distribution of the intensity of energy can be measured by the beam profiler 29 but the accuracy thereof is low. This is because the spatial distribution of the intensity of energy is approximated to a uniform trapezoid by calculating the intensity of energy I (mJ/cm$^2$) at the work point. In other words, the intensity of energy is calculated from the laser output P(W) or the energy Q(J), i.e., the laser output per laser repeated frequency f (Hz), setting a central point of the line beam to the middle of the width (=W) of the distribution where the intensity of energy is 90% or the middle of the half width (=w) in the cross section across the short axis of the line beam.

Therefore, the intensity of energy can be approximated as I=Q/L·W or I=Q/(L·W) (where L (cm) denotes the length of a cut portion of the line beam). However, even if the area integral value of energy is constant as shown in FIG. 6, if the distribution of the intensity is deformed, the peak value and the half width may vary. In this case, the above approximation cannot be established, resulting in low accuracy of the distribution of intensity of energy.

Figure 11B:
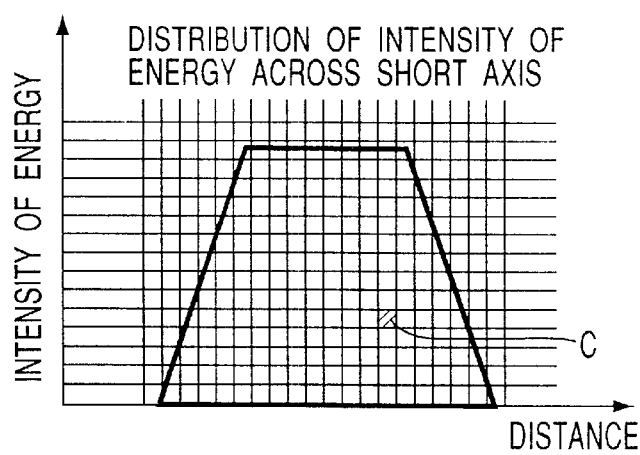
FIG. 11B is a diagram showing a unit division area.
Figure 11A:
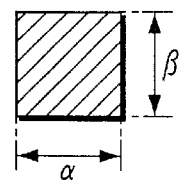
FIG. 11A is a detailed distribution diagram of the intensity of energy obtained by a beam profiler.

It is assumed that the resolution of the beam profiler 29, i.e., the unit distance component of the abscissa axis is α (cm) and the resolution of the detector 23, i.e., the unit intensity component of the ordinate axis is β (mJ/cm$^2$). In this case, the area integral value Δ of the profile of the intensity of energy across the short axis is obtained by multiplying the sum of the number of divided meshes δ shown in FIG. 11A by the area of the mesh. FIG. 11B shows a unit divided area C.

$$\Delta = \delta \cdot \alpha \cdot \beta \quad (7)$$

where α and δ are known, while β is unknown. Therefore, the area of the trapezoid S (J/cm) shown in FIG. 11A is calculated by the following equation based on the value of energy measured by the detector 23:

$$S = Q/L \quad (8).$$

At any measuring point in the short-axis slit 22, the distribution of intensity of energy is statistically averaged so as to be smaller than the average value ξ% in consideration of the standard deviation σ of the stability of energy of the laser oscillator, and the averaged distribution is measured. The number of laser pulses n is given by the following formula. For example, if ξ=2 and σ=2.5, n is equal to or greater than 14.

$$n > (3\sigma/\xi)^2 \quad (9)$$

The control device 25 calculates β from the data of Δ and S. As a result, the unit height per unit distance component of the abscissa axis of the trapezoid shown in FIG. 11 is obtained. Therefore, the values of α·β are integrated cumulatively, so that an accurate shape of the trapezoid can be obtained. Accordingly, accurate energy integrated value and peak value can be obtained.

The beam profiler 29 can measure a point having the maximum intensity of energy for every pixel. Assuming that the maximum energy density is N, the transmittance t(%) of the optical system is given by the following equation:

$$I \cdot t = N \cdot \beta \qquad (10).$$

Figure 12:
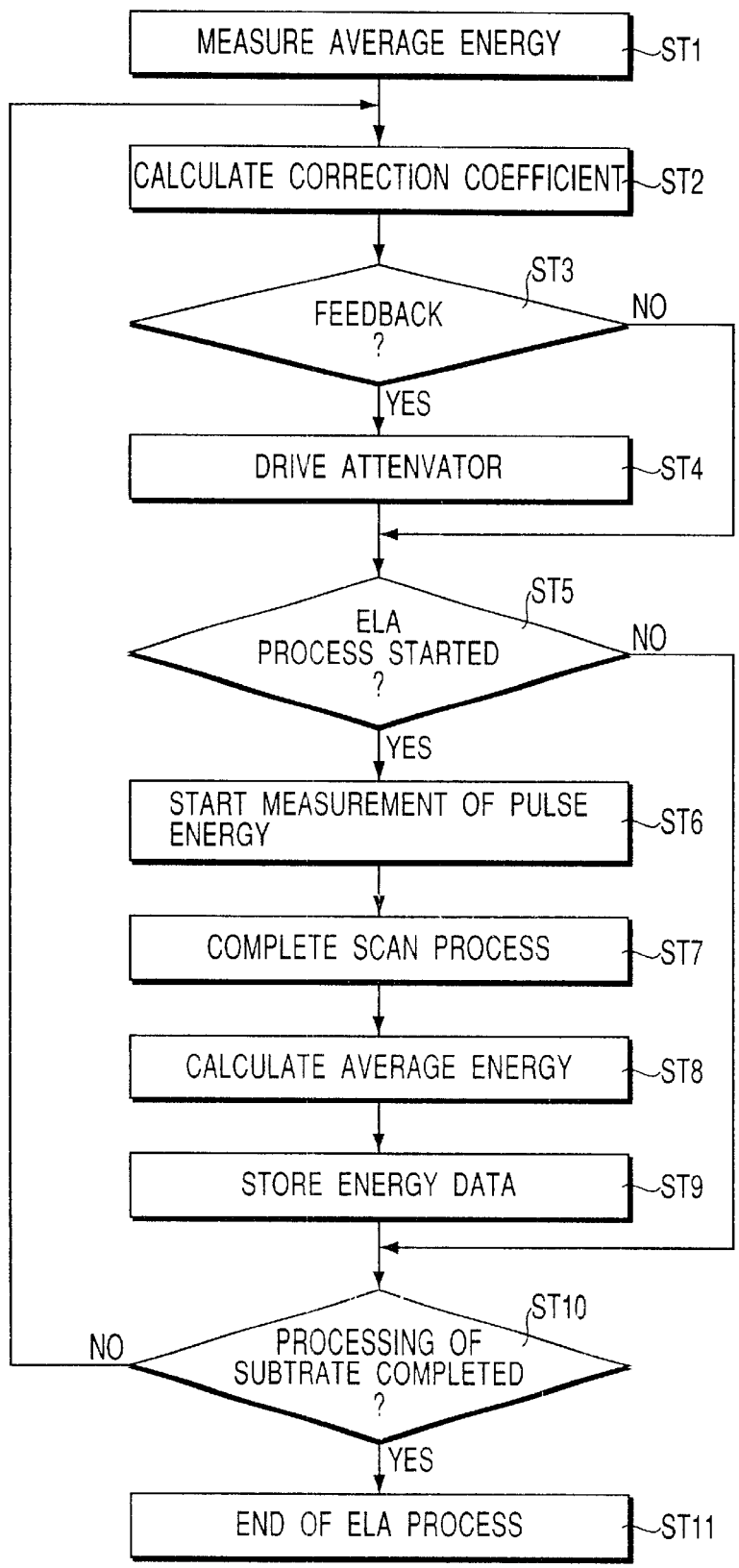
FIG. 12 is a flowchart showing an anneal process carried out by the laser radiating apparatus of the present invention.

FIG. 12 is a flowchart showing the process shown in FIGS. 9 to 11. First, the average energy per unit pulse output from the laser oscillator 1 is measured in order to reduce the influence of energy variation (ST1). A correction coefficient is calculated from the measurement value of the average energy in consideration of a difference between the measured intensity of energy and the set intensity of energy due to attenuation in the optical system or an error in the laser oscillator 1 (ST2).

It is determined, on the basis of the correction coefficient, whether a feedback operation is performed (ST3). If the feedback operation is performed, the variable attenuator 3 is driven (ST4). If not, it is determined whether the anneal process is to be started or not without driving the variable attenuator 3 (ST5). If the anneal process is not to be performed, the process advances to ST10.

If the anneal process is performed, data such as the intensity of energy is measured for every pulse (ST6). Upon completion of one scan (ST7), the average value and variation of the intensity of energy during the anneal process is obtained again by calculation (ST8). These energy data is stored (ST9). The stored energy data is used for quality control in the anneal process.

It is determined whether all scans are ended and the processing of the substrate has been completed (ST10). If all scans are ended, the anneal process is ended (ST11). If not, the flow returns to ST2.

Figure 13:
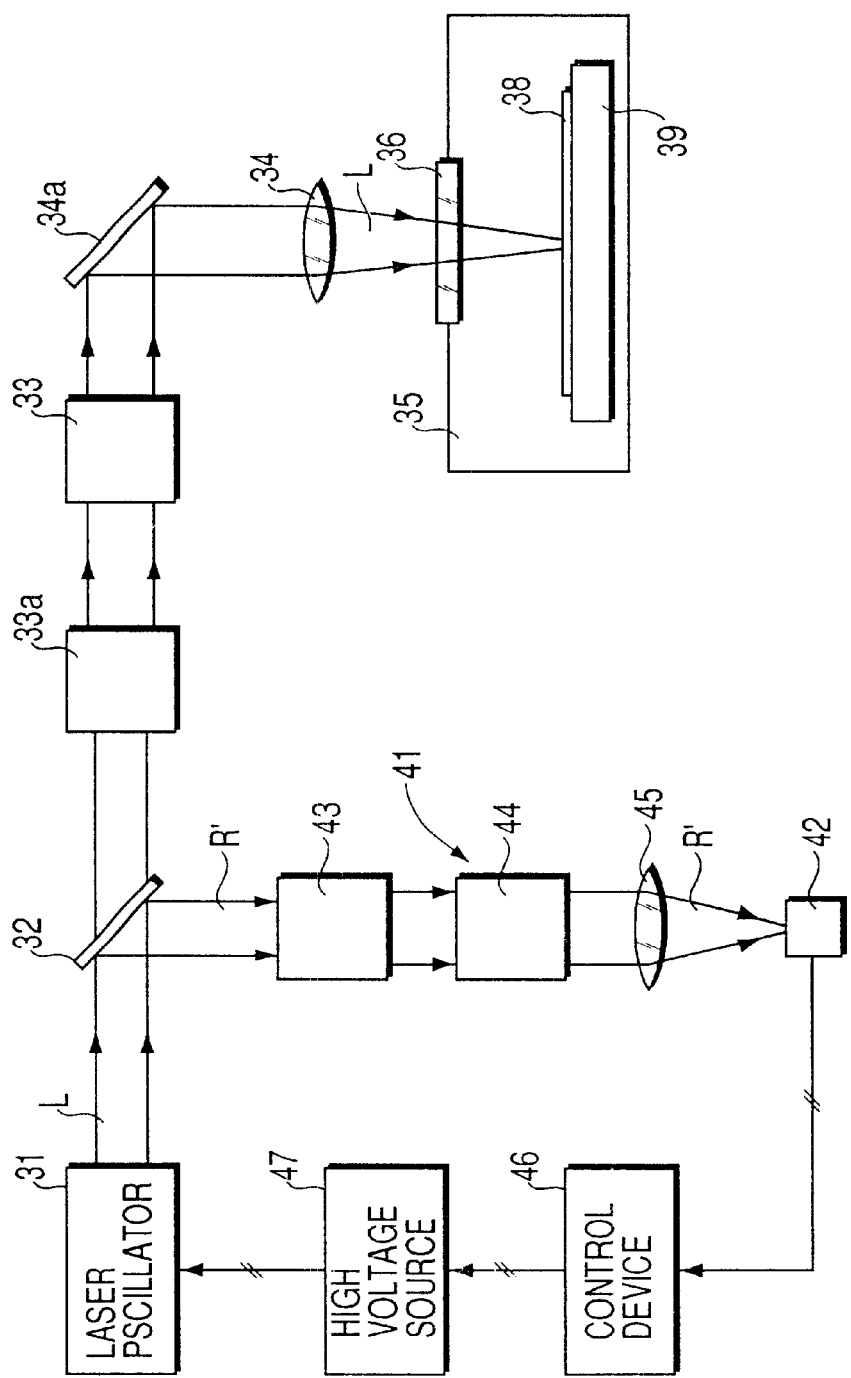
FIG. 13 is a diagram showing the overall structure of a laser radiating apparatus according to a third embodiment of the present invention.
Figure 16:
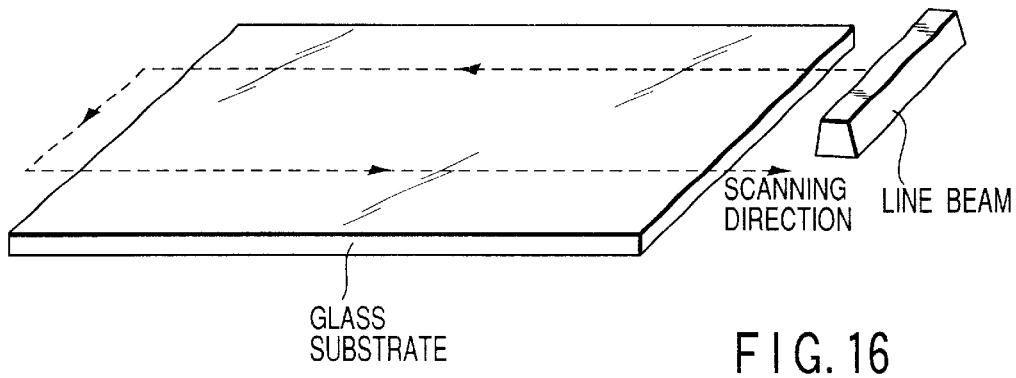
FIG. 16 is schematic perspective view showing a scan of the object (glass substrate) by a laser beam.
Figure 17:
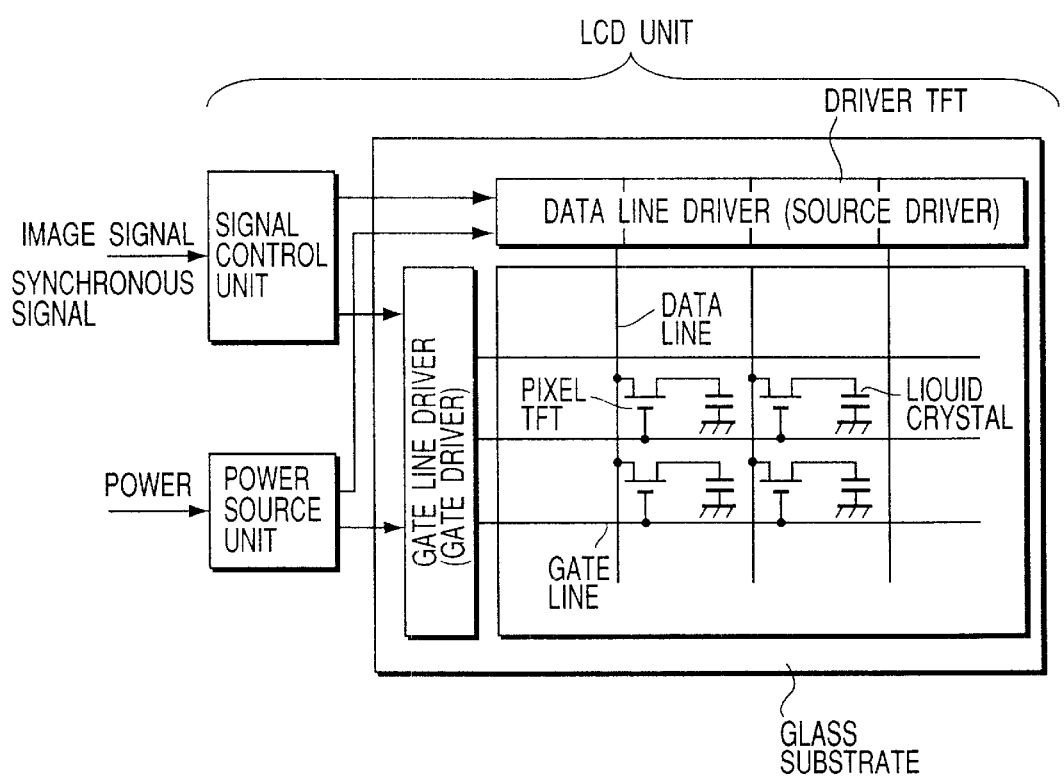
FIG. 17 is a schematic diagram showing a structure of an LCD unit.

FIG. 13 is a schematic diagram showing the structure of a laser radiating apparatus according to a third embodiment of the present invention. The laser radiating apparatus of this embodiment has a laser oscillator 31, such as a XeCl excimer laser, similar to that of the first embodiment described above. A beam splitter 32 is arranged at an angle of 45° in the optical path of a laser beam L output from the laser oscillator 31, so that part of the laser beam L is split.

The laser beam L passed through the beam splitter 32 is input to a first telescope 33a, in which the beam diameter is extended. Then, the distribution of the intensity of energy of the extended beam is substantially uniformed in the long-axis direction and the short-axis direction by a first homogenizer 33.

Thereafter, the laser beam L is reflected by a reflection mirror 34a and converged by a first converging lens 34. The converged beam enters a process chamber 35 through a transmission window 36. As in the first embodiment, the process chamber 35 includes a mount table 39, on which an object 38 is placed. The object 38 is made of a glass substrate for liquid crystal on which an amorphous silicon film is deposited. The laser beam L is radiated on the amorphous silicon film to perform an anneal process.

The split laser beam R' split by the beam splitter 32 passes through equivalent optical means 41 and the intensity of energy thereof is detected by a detector 42. The equivalent optical means 41 comprises the same optical elements as those arranged between the beam splitter 32 and the process chamber 35. In other words, a second telescope 43, a second homogenizer 44 and a second converging lens 45 are interposed between the beam splitter 32 and the detector 42.

Therefore, the optical loss of the laser beam L radiated on the object 38 in the process chamber 35, due to absorption by the optical elements after the laser beam passes through the beam splitter 32 until it is radiated on the object 38, is substantially equivalent to the optical loss of the split laser beam R' split by the beam splitter 32, due to absorption by the optical elements before the split laser beam R' is detected by the detector 42.

When the detector 42 detects the intensity of energy of the split laser beam R', the detection signal is input to a control device 46. A set value in accordance with the kind of the process of the object 38 is set in the control device 46. The control device 46 compares the detection value with the set value.

If there is a difference between the compared values, a high voltage source 47 for supplying excitation energy to the laser oscillator 31 is controlled based on the difference. With this control, the intensity of laser beam output from the laser oscillator 31 is controlled to be the same as the set value set in the control device 46.

The laser radiating apparatus having the above structure includes the equivalent optical means 41 in the optical path of the split laser beam R' split by the beam splitter 32 and detected by the detector 42. The optical loss of the split laser beam is substantially equivalent to that of the laser beam L passed through the beam splitter 32 and radiated on the object 38 in the process chamber 35.

Therefore, the optical loss of the laser beam L output from the laser oscillator 31, passed through the beam splitter 32 and radiated on the object 38 is substantially equivalent to the optical loss of the split laser beam R' reflected by the beam splitter 32 and detected by the detector 42. For this reason, the intensity of energy of the split laser beam R is substantially the same as that of the laser beam L radiated on the object 38.

Consequently, if the intensity of energy of the split laser beam R' is detected and the intensity of energy of the laser beam L is controlled on the basis of the detection result, the intensity of energy of the laser beam L can be set with high accuracy.

A method for producing a liquid crystal display device according to a fourth embodiment of the present invention will be described. This method is realized by the laser radiating apparatus described above. With this method, it is possible to provide a liquid crystal display device of driver monolithic type comprising a non-monocrystalline semiconductor film formed on an object, i.e., a glass substrate 80a, using the aforementioned method for producing a non-monocrystalline semiconductor film.

FIG. 14 shows a cross section of a liquid crystal display device 81. A spacer, a color filter, a light shielding film and a polarizing plate are not shown. Coplanar type thin film transistors, as a semiconductor device, are formed on a glass substrate 80a of the liquid crystal display device 81 through a normal PEP (Photo Engraving Process), etc. More specifically, a P-type TFT 82, an N-type TFT 83 and a pixel TFT 84 are formed. The P-type TFT 82 and the N-type TFT 83, complementary transistors (CMOS), constitute a driving section 85. The pixel TFT 84 constitutes a pixel matrix section (display section) 86.

The TFTS 82 to 84 are formed by shaping an amorphous silicon film into predetermined shapes on a non-monocrystalline silicon film (hereinafter referred to as a polysilicon film) 87, which has a crystallized portion, by the processing method using the anneal process as described above. They are laminated on an undercoat 80b formed on the glass substrate 80a. The polysilicon film 87 includes a channel region 87a through which electrons flow. It also includes a source region 87b and a drain region 87c doped with impurities (donor/acceptor), such as P (phosphorus) or B (boron).

The polysilicon film 87 is covered with a gate insulating film 88. A gate electrode 89 is formed on the gate insulating film 88. The gate electrode 89 is covered with an interlayer insulating film 91. The interlayer insulating film 91 has a contact hole, through which the source region 87b is connected to a source electrode 92a and the drain region 87c is connected to a drain electrode 92b.

The pixel TFT 84 is connected to a source electrode line (signal line) 93a via the source electrode 92a and to a pixel electrode 93b made of ITO (Indium Tin Oxide) film via the drain electrode 92b. The source region 87b and the drain region 87c may be replaced with each other, in which case the liquid crystal display device 81 can be operated.

A counter glass substrate 102 is arranged above the glass substrate 80a, on which the aforementioned semiconductor device is formed, with a predetermined distance with spacers interposed therebetween. A counter pixel electrode (common electrode) 101 made of ITO film is formed under the glass substrate 102. A space is formed between the glass substrate 80a and the counter glass substrate 102 in a portion constituting the pixel matrix portion 86. The periphery of the space is sealed with a sealing agent. The sealed space between the glass substrate 80a and the counter glass substrate 102 is filled with liquid crystal 103.

The liquid crystal 103 may be dropped on the glass substrate 80a or the counter glass substrate 102 before the substrates are sealed with the sealing agent, and thereafter, the glass substrate 80a and the counter glass substrate 102 are adhered with each other. Alternatively, after the substrates are sealed with the sealing agent, the liquid crystal 103 may be injected or vacuum-sucked into the sealed space through a sealing agent injecting port. Alignment films 104 are formed on the glass substrate 80a and the counter glass substrate 102 corresponding to the pixel matrix portion 86. The liquid crystal 103 is sandwiched between the alignment films 104. Further, as shown in FIG. 15, the gate electrode 89 is connected to a gate electrode (scanning line) 105.

The liquid crystal display device 81 having the above semiconductor device includes semiconductor devices, TFTS, obtained from the polysilicon film 87 crystallized by the processing method using the anneal process carried out by means of the laser radiating apparatus described above. With -the anneal process, the crystallization of an amorphous silicon film is accelerated, so that a suitable electron mobility can be obtained.

Thus, the present invention prevents manufacture of a semiconductor device from a polysilicon film 87 which does not have an optimal electron mobility. Consequently, the yield in the process of manufacturing liquid crystal display devices incorporating the semiconductor device is improved.

The present invention is not limited to the above embodiments, but can be modified variously. For example, the intensity of energy of the laser beam may be controlled on the basis of a value detected by means of the detector by the method of controlling the incident angle of the laser beam with respect to the variable attenuator as in the first embodiment. Alternatively, it may be controlled by the method of controlling the high voltage source for exciting the laser oscillator as in the third embodiment. In summary, the intensity of a laser beam may be controlled by any method. Besides, the present invention can be modified variously within the scope of the gist of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser radiating apparatus for controlling an intensity of energy of a laser beam output from a laser generating means and radiating an object with the laser beam, said apparatus comprising:

intensity homogenizing means for substantially homogenizing distribution of the intensity of energy of the laser beam;

converging optical means for condensing the laser beam substantially homogenized by the intensity homogenizing means and radiating the object with the laser beam;

shaping means for removing a part containing the substantially homogenized laser beam of the condensed laser beam and shaping it into a predetermined beam shape;

detecting means for detecting an intensity of energy of the part containing the substantially homogenized laser beam of the laser beam removed by the shaping means; and control means for controlling the intensity of energy of the laser beam based on a detection signal output from the detecting means.

2. A laser radiating apparatus according to claim 1, wherein:

the laser beam incident on the shaping means has a rectangular beam shape having a long axis and a short axis; and the shaping means remove both end portions of the rectangular beam shape along the long axis.

3. A laser radiating apparatus according to claim 1, wherein the detecting means comprises:

a reflection mirror for reflecting the part of the laser beam removed by the shaping means into a predetermined direction;

a detector on which the part of the laser beam reflected by the reflection mirror is incident; and a slit, located between the detector and the reflection mirror, for removing a part of the laser beam incident on the detector.

4. A laser radiating apparatus for controlling an intensity of energy of a laser beam and radiating an object with the laser beam, said apparatus comprising:

a laser generating means;

intensity homogenizing means for substantially homogenizing distribution of the intensity of energy of the laser beam;

converging optical means for condensing the laser beam substantially homogenized by the intensity homogenizing means and radiating the object with the laser beam;

splitting means for splitting a part of the laser beam output from the laser generating means;

detecting means for detecting an intensity of energy of the part of the laser beam split by the splitting means;

control means for controlling the intensity of energy of the laser beam based on a detection signal output from the detecting means; and equivalent optical means, located between the splitting means and the detecting means, for providing the laser beam split by the splitting means with an optical loss substantially equivalent to an optical loss provided for the laser beam radiated on the object.

5. A laser radiating apparatus according to claim 4, wherein the equivalent optical means are optical means having a same structure as those of the intensity homogenizing means and the condensing optical means.

6. A laser radiating apparatus for controlling an intensity of energy of a laser beam output from a laser generating means and radiating an object with the laser beam, said apparatus comprising:

intensity homogenizing means for substantially homogenizing distribution of the intensity of energy of the laser beam;

converging optical means for condensing the laser beam substantially homogenized by the intensity homogenizing means and radiating the object with the laser beam;

shaping means for removing a part containing the substantially homogenized laser beam of from the condensed laser beam and shaping it into a predetermined beam shape;

detecting means for detecting an intensity of energy of the part of the laser beam removed by the shaping means; and control means for controlling the intensity of energy of the laser beam based on a detection signal output from the detecting means, the detecting means comprising:

a reflection mirror for reflecting the part of the laser beam removed by the shaping means into a predetermined direction;

a detector on which the part of the laser beam reflected by the reflection mirror is incident; and a slit, located between the detector and the reflection mirror, for removing a part of the laser beam incident on the detector.

7. A laser radiating apparatus according to claim 6, wherein:

the laser beam incident on the shaping means has a rectangular beam shape having a long axis and a short axis; and the shaping means remove both end portions of the rectangular beam shape along the long axis including a portion in which the intensity of energy is substantially homogenized by the intensity homogenizing means.

* * * * *